United States Patent
Gupta et al.

[11] Patent Number: 6,118,350
[45] Date of Patent: Sep. 12, 2000

[54] BUS THROUGH TERMINATION CIRCUIT

[75] Inventors: Atul Krishna Gupta, Burlington; Dino Toffolon, Stoney Creek, both of Canada

[73] Assignee: Gennum Corporation, Burlington, Canada

[21] Appl. No.: 09/188,530

[22] Filed: Nov. 10, 1998

[51] Int. Cl.[7] .............................. H01P 1/26; H03K 19/003
[52] U.S. Cl. ...................... 333/22 R; 257/536; 257/664; 326/30
[58] Field of Search ................... 333/22 R, 124, 333/127, 128; 326/30; 257/533, 536, 664

[56] References Cited

U.S. PATENT DOCUMENTS

| | | | |
|---|---|---|---|
| 4,626,804 | 12/1986 | Risher et al. | 333/22 R |
| 4,626,889 | 12/1986 | Yamamoto et al. | 333/22 R X |
| 5,578,940 | 11/1996 | Dillon et al. | 326/30 |
| 5,721,497 | 2/1998 | Novak | 326/30 |

*Primary Examiner*—Paul Gensler
*Attorney, Agent, or Firm*—Bereskin & Parr

[57] ABSTRACT

A system of resistive end termination and transmission line routing is disclosed for matching the impedance of an IC load to that of a signal source and a transmission line. Each integrated circuit has an internal termination resistor designed to match the characteristic impedance of the transmission line and preferably also the impedance of the source. When the source drives multiple IC devices on a printed circuit board, the devices are cascaded in a chain with the internal resistors of all but the last IC device in the chain bypassed by a short circuit underneath the device, so that a continuous transmission line is provided to the last IC device. The last IC in the chain, which does not have a short circuit underneath it, provides the necessary resistive termination by simply connecting the appropriate pin to a common reference in the circuit. The invention is also applicable to differential applications in which first and second complementary signal sources feed each IC device.

21 Claims, 3 Drawing Sheets

BUS THROUGH TERMINATION CIRCUIT

FIELD OF THE INVENTION

The present invention relates to the field of data bus communication, cable drivers, line drivers, buffers, and integrated circuit or monolithic technology. In particular, the present invention relates to a system for eliminating analog or digital signal reflections by way of resistive end terminations in integrated circuits.

BACKGROUND OF THE INVENTION

Impedance matching of an electrical load to the impedance of a signal source and the characteristic impedance of a transmission line is often necessary to reduce reflections by the load back into the transmission line. As the length of a non-terminated transmission line increases, reflections become more and more problematic. When high frequency signals are transmitted or passed through even very short transmission lines, such as printed circuit board (PCB) traces, a resistive termination is typically inserted at the load to avoid reflections and degradations in performance.

When the load comprises one or more integrated circuit devices, the terminal resistor may be either internal or external to the integrated circuit device. The placement of a resistor outside an integrated circuit device results in an additional stub or short transmission line between the resistor and the integrated circuit device. External resistors are also relatively bulky, and so they undesirably increase the required footprint or area for an application. On the other hand, resistors which are internal to an integrated circuit device do not allow for the flexibility of being removed. This is of particular concern when multiple integrated circuit devices are being fed by the same signal along a common transmission line, because the source and transmission line will see a parallel combination of the internal resistors, resulting in an impedance mismatch. Furthermore, when a signal is transmitted or passed to multiple integrated circuit devices, the transmission line along which the signal passes typically must bend, curve, or turn around each integrated circuit device. These bends, turns, and curves can cause impedance discontinuities in the characteristic impedance of the transmission line, and further result in impedance mismatches.

Thus, there is a need for an integrated circuit resistive end termination and transmission line routing system for applications incorporating integrated circuits on a PCB that provides for accurate impedance matching, minimal reflections, efficient signal routing, and a minimal application footprint.

BRIEF SUMMARY OF THE INVENTION

The present invention provides a system of resistive end termination and transmission line routing for matching the impedance of an IC load to that of a signal source and a transmission line. Each integrated circuit has an internal termination resistor designed to match the characteristic impedance of the transmission line and preferably also the impedance of the source. When the source drives multiple IC devices on a printed circuit board, the devices are cascaded in a chain with the internal resistors of all but the last IC device in the chain bypassed by a short circuit underneath the device, so that a continuous transmission line is provided to the last IC device. The last IC in the chain, which does not have a short circuit underneath it, provides the necessary resistive termination by simply connecting the appropriate pin to a common reference in the circuit. The signal is preferably routed in a straight or direct line as it passes underneath each bypassed IC device and as it passes from one IC device to the next, so as to avoid impedance transitions caused by sharp bends or angles.

Applications requiring differential signal paths can also be accommodated. For differential applications, first and second complementary signal sources feed each IC device along a chain by way of first and second transmission lines respectively. Each integrated circuit has first and second internal termination resistors, the first resistor designed to match the characteristic impedance of the first transmission line and preferably also the impedance of the first source, and the second resistor designed to match the characteristic impedance of the second transmission line and preferably also the impedance of the second source. The transmission lines bypass the resistors in each IC device except the last IC device in the chain so that continuous transmission lines are provided to the last IC device. The first and second resistors of the last IC device are terminated by shorting them together. Again, the first and second transmission lines preferably pass underneath each bypassed IC device and from one IC device to the next in a straight line.

Thus, in a first aspect the present invention provides a transmission line circuit comprising: (a) a circuit board having at least one layer; (b) a signal source for providing a signal, said signal source having a source impedance; (c) a transmission line running along said circuit board for transmitting the signal, said transmission line having a characteristic line impedance; (d) two or more integrated circuit (IC) devices including one chain-ending IC device, each of said two or more IC devices being positioned along said circuit board so as to receive the signal from said signal source by way of said transmission line, and each of said IC devices having an INPUT pin, an IN/TERM pin, and an internally located resistor coupled between said INPUT pin and said IN/TERM pin, said resistor having a resistive value which matches said line impedance; (e) said transmission line being connected to the INPUT pin and the IN/TERM pin of each of said two or more IC devices other than the chain-ending IC device, so that the internal resistor of that device is bypassed by said transmission line; and (f) said transmission line further being connected to the INPUT pin of the chain-ending IC device, and the IN/TERM pin of the chain-ending IC device being connected to a reference.

In another aspect, the present invention provides a transmission line circuit comprising: (a) a circuit board having at least one layer; (b) a first signal source for providing a first signal, said first signal source having a first source impedance; (c) a second signal source for providing a second signal complementary to said first signal, said second signal source having a second source impedance equal to the first source impedance; (d) a first transmission line running along said circuit board for transmitting the first signal, said first transmission line having a first characteristic line impedance; (e) a second transmission line running along said circuit board for transmitting the second signal, said second transmission line having a second characteristic line impedance equal to the first characteristic line impedance; (f) two or more integrated circuit (IC) devices including one chain-ending IC device, each of said two or more IC devices being positioned along said circuit board so as to receive the first signal from said first signal source by way of said first transmission line and to receive the second signal from said second signal source by way of said second transmission line, each of said IC devices having a first INPUT pin, a first IN/TERM pin and a first internally located resistor coupled between said first INPUT pin and said first IN/TERM pin, said first resistor having a resistive value which matches said first line impedance, each of said IC devices further having a second INPUT pin, a second IN/TERM pin and a second internally located resistor coupled between said second INPUT pin and said second IN/TERM pin, said second resistor having a resistive value which matches said second line impedance; (g) said first transmission line being connected to the first INPUT pin and the first IN/TERM pin of each of said two or more IC devices other than the chain-ending IC device, so that the first internal resistor of that device is bypassed by said first transmission line; (h) said second transmission line being connected to the second INPUT pin and the second IN/TERM pin of each of said two or more IC devices other than the chain-ending IC device, so that the second internal resistor of that device is bypassed by said second transmission line; and (i) said first transmission line further being connected to the first INPUT pin of the chain-ending IC device, said second transmission line further being connected to the second INPUT pin of the chain-ending IC device, and the first IN/TERM pin and the second IN/TERM pin of the chain-ending IC device being connected to one another.

Further features and advantages of the invention will appear from the following description, taken together with the accompanying drawings.

BRIEF DESCRIPTION OF THE DRAWINGS

In the drawings, which illustrate preferred embodiments of the present invention.

DETAILED DESCRIPTION OF THE INVENTION

Transmission lines are designed to transfer signal energy from one location to another. As is well known in the art, a transmission line, such as a trace or backplane bus on a printed circuit board or a coaxial cable, is often modeled as a number of capacitor-inductor combinations in series with another. The characteristic impedance, $Z_0$, of a transmission line is the ratio of the electrical field strength (V/m) to magnetic field strength (A/m) for signals propagating through the transmission line. The characteristic impedance of a transmission line is essentially determined by the materials used for the conductors, the size and spacing of the conductors, and the type of dielectric used between them. At high frequencies, such as in buses for digital systems, the characteristic impedance is predominantly real and is approximately equal to the square root of the per unit length inductance divided by the per unit length capacitance. Thus, the length of the transmission line does not affect the value of its characteristic impedance.

Generally speaking, the time required for a signal to travel from one end of a non-terminated transmission line and back should be considerably less than the transition (i.e. rise and fall) times of the driving signal, as discussed in Sedra, Smith, Microelectronic Circuits (Oxford University Press, 1991). For signals with short transition times (for e.g., 10 nanoseconds or less) and fast propagation speeds (of the order of the speed of light), this will usually not be the case and so a matched or terminated transmission line must be used. Proper termination of an electrical load requires that the output end of the transmission line have an input impedance which is equal to the characteristic impedance of the transmission line as well as the impedance of the source, so that all of the power is provided to the load rather than being reflected by the load back into the transmission line. (Note that it is possible to match the load or output end of a line to the characteristic impedance of the line without also matching the source or input end of the line to the characteristic impedance of the line. However this is usually desirable since it minimizes signal reflections at the source end.) In an integrated circuit device, reflections of transmitted signals may cause degradations in circuit performance (i.e. noise).

To prevent reflections caused by impedance mismatch at the load, termination resistors are used to match the characteristic impedance of the transmission line. The added end termination resistors match the impedance of the transmission line (i.e. the characteristic impedance $Z_0$) as well as preferably the impedance of the source signal, so that $R_{source}=Z_0=R_{term}$.

Figure 1:
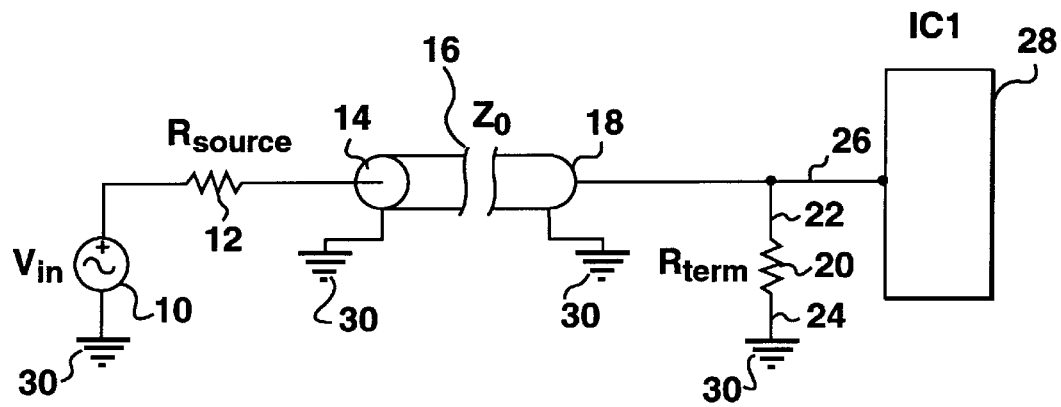
FIG. 1 shows an application in which an integrated circuit device has an external resistive termination according to the prior art.

As shown in FIG. 1, in integrated circuit devices termination resistors are typically placed outside the integrated circuit (IC) or semiconductor chip in the form of a discrete resistor. Referring to FIG. 1, a signal source 10 including its effective output resistance 12 is connected to the front-end 14 of a transmission line 16 having characteristic impedance Z0. The signal source may be a cable driver, a line driver, or any other signal with a known source resistance. The other end 18 of the transmission line 16 is coupled to a first terminal 22 of termination resistor ($R_{term}$) 20. Terminal 22 of resistor 20 is coupled to IC device 28 via stub or short trace 26. The other terminal 24 of termination resistor 20 is connected to a common reference 30.

Externally placed resistors allow for flexibility, particularly in devices where several chips are used. However, externally placed resistors considerably increase the required footprint or area for an application. Furthermore, placing the resistor outside the chip results in a stub 26 on the transmission line, and so the signal is not terminated at the very end of the line as it should be.

Figure 2:
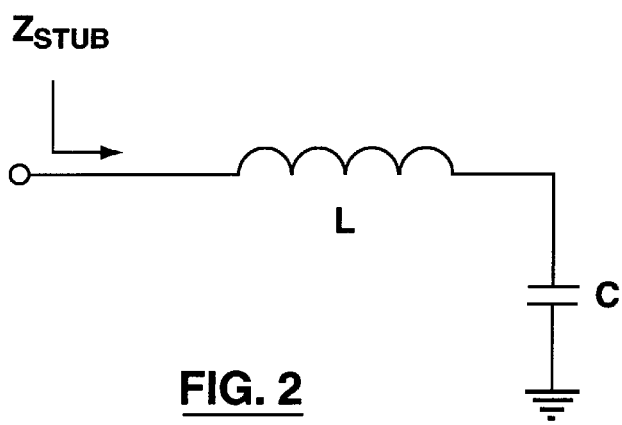
FIG. 2 is a transmission line model of the transmission line stub of FIG. 1.

As shown in FIG. 1, the stub 26 is a short section of transmission line which is patched on to the main line and results in a parasitic trace. The transmission line is matched at the point where it meets the terminal 22 of resistor 20. However, due to the stub 26, the signal 10 does not see the same impedance all the way into the chip 28. FIG. 2 shows an equivalent circuit model of the transmission line stub 26 in which the short trace includes an inductance L and a capacitance C, as shown. Therefore, the stub 26 results in improper termination and reflections could result.

Figure 3:
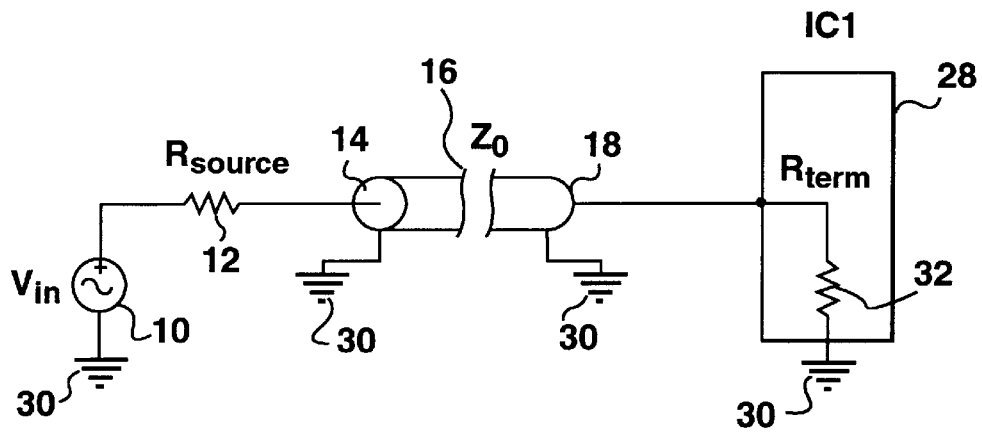
FIG. 3 shows an application in which an integrated circuit device has an internal resistive termination according to the prior art.

Placing a terminating resistor 32 inside the IC chip 28, as shown in FIG. 3, solves the problems caused by stubs on the transmission line (since stub 26 is eliminated) and, in addition, reduces the required application footprint area. However, this termination technique greatly has been avoided in prior art systems because it reduces the functionality of the IC due to the fact that the termination resistor cannot be removed. The inability to remove the terminating resistor is of particular concern where the source is required to drive multiple integrated circuit devices, since impedance matching in such cases requires that the source see an equivalent impedance equal to its own impedance across all of the IC devices.

Figure 4:
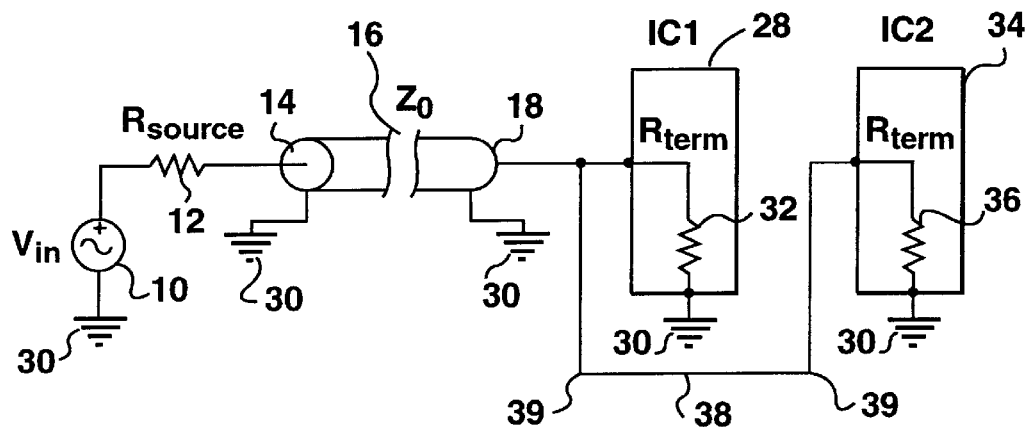
FIG. 4 illustrates an application in which multiple integrated circuit devices each have an internal resistive termination.

FIG. 4 illustrates the problem of impedance matching using internal end-termination resistors when multiple integrated circuit chips 28 and 34 are being driven by the same source 10. As shown in FIG. 4, IC1 28 has an internal impedance matching resistance 32 of value $R_{term}$, and similarly IC2 34 has an internal impedance matching resistance 36 of value $R_{term}$. Because each of IC1 28 and IC2 34 has its own termination resistor, the source sees the parallel combination of all the internal termination resistors (in FIG. 4, $R_{term} \| R_{term} = \frac{1}{2} R_{term}$), causing a mismatch in impedance. Thus, the IC connections in FIG. 4 result in improper or mismatched termination, since the load impedance is half that of the source and reflections consequently result. Similar problems occur when more than two IC devices are being driven by a single source, as will be apparent to those skilled in the art. Thus the impedance matching technique of FIG. 4 can only be used when the exact number of integrated circuit chips to be driven by a source is known and fixed beforehand—a severe limitation.

A secondary problem which arises when the integrated circuit chips are cascaded as shown in FIG. 4 is the cumbersome routing and connections required to route the signal from one IC onto the next. As illustrated by FIG. 4, a long trace 38 around IC1 is required to route the signal 10 to IC2 34 which leads to several drawbacks. Long traces increase the footprint for an application and require additional wiring or trace materials to be used. Second, routing a trace around an IC necessitates bends or turns 39 in the trace which produce discontinuities in the characteristic impedance of the trace. These impedance discontinuities or transitions are difficult to match and will consequently result in further reflections.

Figure 5:
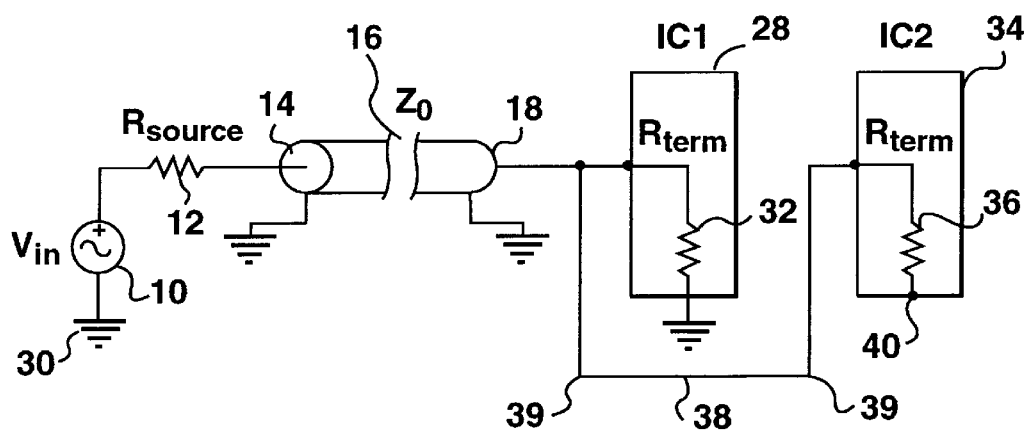
FIG. 5 shows a modification of FIG. 4 in which all but one of the internal resistive terminations are left floating.

One possible solution to the prior art problems associated with internal resistor terminations is to simply connect only the internal resistor 32 of the first IC (IC1 in FIGS. 4 and 5) to the common reference 30 and to leave the other internal resistors floating. This technique, which is illustrated in FIG. 5, does provide proper termination, but it still results in poor routing (with the long stub 38 to the next IC remaining).

Figure 6:
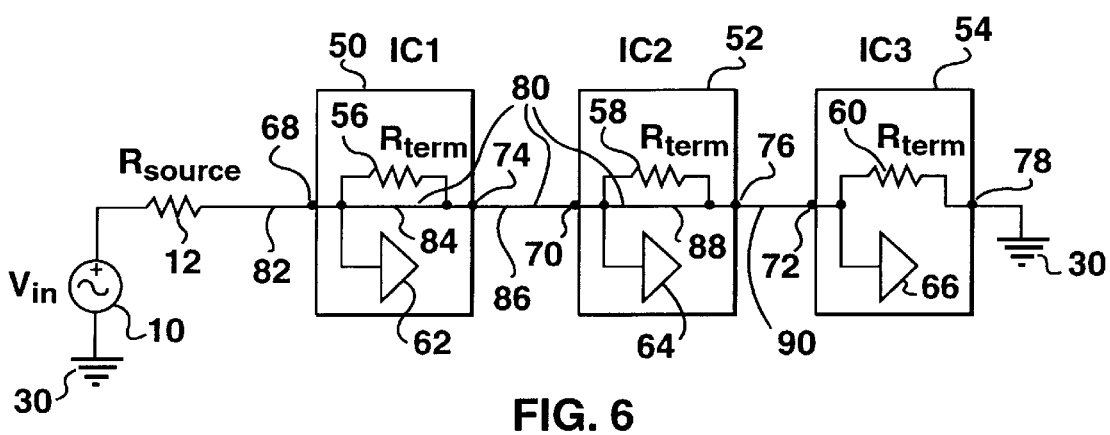
FIG. 6 shows a first embodiment of the resistive termination and transmission line routing system for an application requiring one or more integrated circuits, in accordance with the present invention.

FIG. 6 shows a preferred embodiment of the termination and routing system according to the present invention in which multiple integrated circuit chips IC1 50, IC2 52, and IC3 54 are driven by the same single-ended source 10. FIG. 6 shows a signal source 10 with source resistance 12 of value $R_{source}$ which drives three IC chips 50, 52, and 54 each having an internal resistor of value $R_{term}$ (internal resistors 56, 58, and 60 respectively). Although three ICs are shown in FIG. 6, the system of the present invention is equally suitable to applications having any number of IC devices. Each of the IC chips IC1 50, IC2 52, and IC3 54 has an INPUT pin (68, 70, and 72 respectively) and a termination or feed through pin, IN/TERM (74, 76, and 78 respectively). The internal termination resistor of each IC device is connected between the INPUT and IN/TERM pins of that device. The high impedance input stages 62, 64, and 66 of the IC chips 50, 52, and 54 respectively are also operatively connected to the INPUT terminals 68, 70, and 72 respectively. A "straight" transmission line or trace 80 on a printed circuit board (PCB) preferably passes underneath the IC devices. The trace 80 is preferably straight in that it does not contain bends, turns, or angles as it passes along a layer of the PCB. It will be clear that the term printed circuit board or PCB is intended to embrace any surface or substrate on which integrated circuit devices can be mounted, including multi-layer circuit boards having a plurality of layers. Note that for ease of reference, the transmission line models 16 of FIGS. 1, and 3–5 are not shown in FIG. 6.

The termination and routing system of FIG. 6 has four main features.

First, each of the IC chips (50, 52, and 54) has an internal termination resistor of value $R_{term}$ which singularly or individually matches the $R_{source}$ impedance 12 of the driving signal and the characteristic impedance $Z_0$ of the transmission line (not shown). For optimum matching, these internal termination resistors preferably exhibit a tight control in terms of both their absolute value (for example, a tolerance within ±1%) and their temperature coefficient (for example within ±200 ppm/° C).

Second, the pinout architecture of each IC device is preferably configured such that the INPUT pin on one side of the IC is lined up directly across from the termination or feed through (IN/TERM) pin on the opposite side.

Third, the PCB routing architecture preferably includes a straight transmission line or trace 80 which runs directly underneath each IC, except the last, from its INPUT pin to its feed through/termination pin on the other side so as to bypass the internal termination resistor. As is understood by those skilled in the art, the straight trace 80 may run along one layer or several layers of the PCB, the former being preferable so as to minimize the use of conductive vias in the PCB. Therefore, the IC devices are all positioned on the circuit board so that the INPUT and IN/TERM pins of the devices all line up along the trace 80. In order to avoid or minimize the inclusion of conductive vias in the circuit board (which can potentially give rise to further signal reflections), the trace 80 is preferably on the same layer of the PCB as the IC devices.

Fourth, the IN/TERM pin on each IC can be used either as a feed through pin to pass the signal on to the next chip or as a termination connection when the IC is positioned as the last device in a chain. The IN/TERM pin of the last IC device is connected to a common reference, which in the illustrated embodiment of FIG. 6 is the reference 30.

The topology of the present invention significantly reduces reflections and routing from one IC chip to another. When an IC device is not the last in the chain, its internal resistor is bypassed and its IN/TERM pin simply passes the signal on to the next IC. However, when the device is the last in the chain (e.g. IC3 in FIG. 6), the IN/TERM pin is connected to a common reference (which in FIG. 6 is the reference 30) to provide the proper termination. In addition, because the pins/resistors of the IC devices in the chain are configured in a straight line and allow for a straight PCB trace (transmission line) from the source to each input pin, any stubs with sharp angles and the accompanying impedance discontinuities are eliminated.

Figure 7:
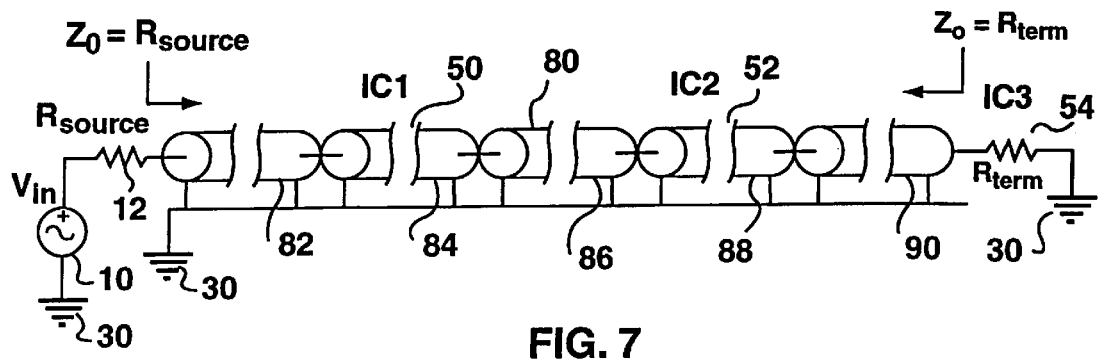
FIG. 7 is an equivalent model of the transmission line circuit of FIG. 6.

An equivalent circuit model of the impedance seen by the source is shown in FIG. 7. The resistance $R_{term}$ matches the characteristic impedance Z0 of the transmission line 80 (i.e. the straight PCB trace) which passes through or underneath all of the IC devices in the .chain except the last IC device, IC3. To eliminate reflections at the transmitting end of transmission line 80 the source resistance $R_{source}$ should also match the characteristic impedance $Z_0$, as indicated. Sections 82, 84, 86, 88 and 90 of transmission line 80 are similarly labelled in FIGS. 6 and 7.

Figure 8:
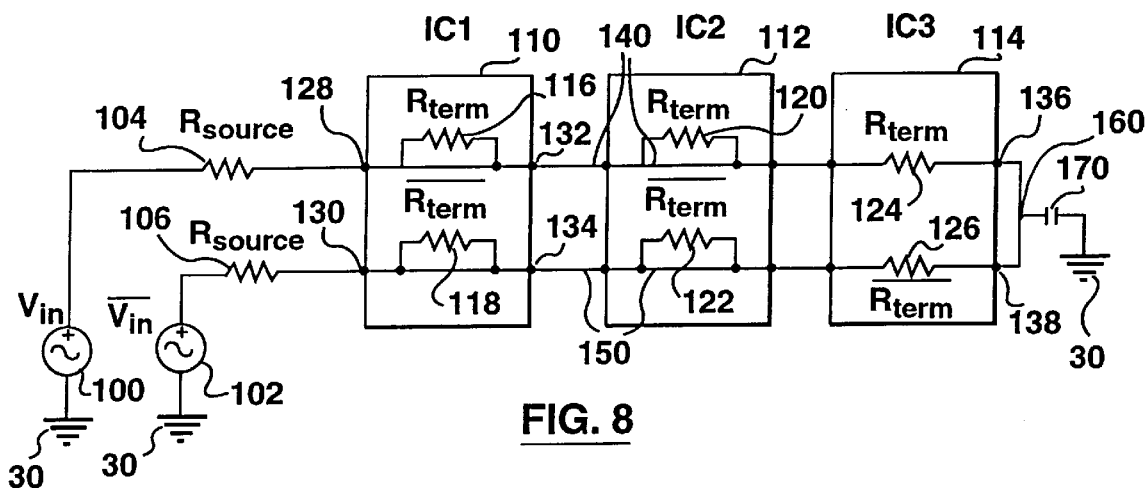
FIGS. 8 and 9 illustrate a second embodiment of the resistive termination and transmission line routing system of the present invention for a differential signal path.

The system of the present invention is equally suitable for applications which use or require a fully differential signal path, as shown in the embodiment of FIG. 8. In known manner, the differential bus dedicates a pair of transmission lines to two complementary signal sources whose difference forms a differential signal. Referring to FIG. 8, a first source 100 having a source resistance 104 drives a cascading IC device chain comprising IC1 110, IC2 112, and IC3 114 via a first transmission line or trace 140. Similarly a second, complementary source 102 having a source resistance 106 equal to source resistance 104 drives the IC devices 110, 112, and 114 via a second transmission line or trace 150. Note that in FIG. 8, as in FIG. 6, the transmission line models have been omitted for ease of reference.

For differential source applications, as illustrated in FIG. 8, each of the IC chips has two pairs of INPUT and IN/TERM pins. Each of these INPUT-IN/TERM pin pairs is lined up along the transmission lines 140 and 150 respectively in a manner similar to the configuration for single-ended applications. These pins are illustrated for IC1 110 in FIG. 8 where a first INPUT pin 128 and a first IN/TERM pin 132 are lined up along transmission line 140, and a second INPUT pin 130 and a second IN/TERM pin 134 are lined up along transmission line 150. The transmission lines 140 and 150 have equal characteristic impedance values. A first internal termination resistance ($R_{term}$) 116 is connected across pins 128 and 132, while a second internal termination resistance 118 ($\overline{R_{term}}$) is connected across pins 130 and 134. Note that the resistance 116 of value $R_{term}$, which matches the transmission line 140 and the resistance 118 of $\overline{R_{term}}$ which matches the transmission line 150 are equal.

Referring to FIG. 8, all of the IC devices except the last have their INPUT and IN/TERM pins shorted by traces 140 and 150, thus bypassing the internal resistors. The traces 140 and 150 do not continue underneath the last IC device, IC3 114 in FIG. 8, which has its IN/TERM pins (136 and 138 for IC3) shorted together to create a node 160 which acts as virtual ground and at which the two differential signals cancel one another. A decoupling capacitor 170 from the node 160 to the reference 30 can optionally be used to remove any common mode reflections.

Figure 9:
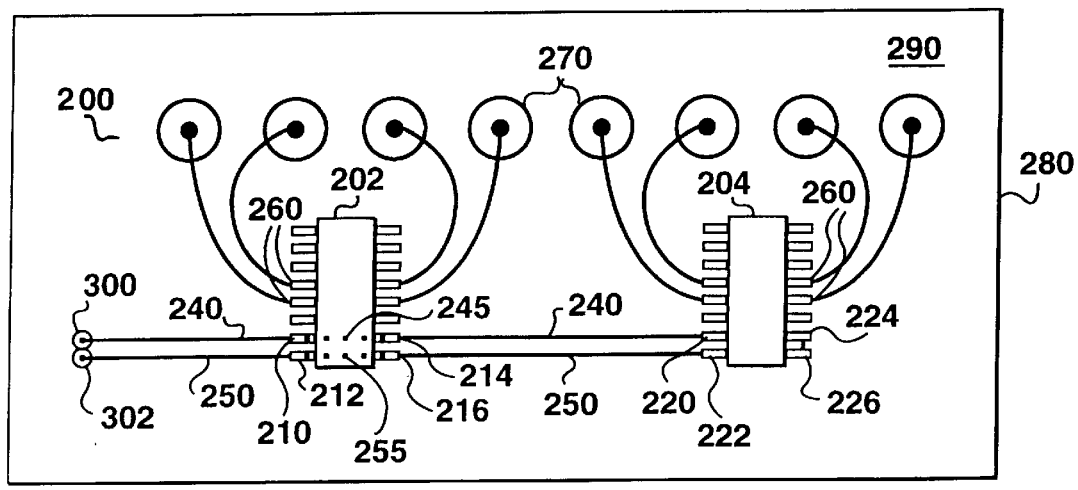

FIG. 9 shows an exemplary transmission line circuit 200 on a circuit board 280, for an application with a differential driving signal path. The differential circuit of FIG. 9 shows the preferred pinout configuration for IC devices 202 and 204 in which the INPUT pins 210, 212, 220, and 222 are directly across from the IN/TERM pins 214, 216, 224, and 226 respectively. In addition, IC devices 202 and 204 are positioned or placed such that pins 210 and 214 of device 202 and pin 220 of device 204 are in electrical contact with trace 240, and pins 212 and 216 of device 202 and pin 222 of device 204 are in electrical contact with trace 250. Because device 204 is positioned as the last device in the IC chain, traces 240 and 250 do not continue underneath IC device 204, and so IN/TERM pins 224 and 226 of IC 204 are not directly connected to traces 240 and 250 respectively (i.e. they are connected through an internal resistor).

The traces 240 and 250 transmit the complementary inputs 300 and 302 respectively to the IC devices. The traces 240 and 250 pass underneath IC device 202 and any other IC device which is positioned in "front of" IC device 204, as illustrated at 245 and 255 in FIG. 9. The on chip or internal input termination resistors of the differential configured IC devices are connected in such a manner that, by simply shorting the pins 224 and 226 of the last device 204 on the bus, a proper impedance matched termination is achieved. Also, as shown in FIG. 9, the signals from pins 260 of IC devices 202 and 204 are directed to the appropriate application outputs 270. As illustrated, the traces 240 and 250 run along the same layer 290 of circuit board 280) that the IC devices (202 and 204) are positioned or mounted upon.

Thus the present invention simply requires that the location of the last or the terminal IC device on the circuit board or backplane be fixed for a given application. Multiple IC devices can then be placed ahead or in front of the last IC device in the direction of the signal source along the preferably straight transmission line trace (or traces for differential signal paths). In addition, any IC device having the bypass-able termination resistor and pinout architecture of the present invention can be placed at any position in the chain without affecting the matching of impedance to the line. If only one IC is required in an application, it is simply connected and positioned as the last device.

In accordance with the present invention, the integrated circuit devices or chips are cascaded in such a way that only one IC in the chain provides the termination, no stubs result, and the routing from chip to chip is clean. The present invention provides an elegant implementation which allows for proper resistive end termination which matches the impedance of a load to that of a source and a transmission line. Furthermore, the system of the present invention eliminates the need for external end terminations, allows for multiple IC devices to be cascaded efficiently with straight transmission line signal routing, and therefore minimizes reflections caused by stubs and/or impedance mismatch. As a result, the functionality of internal termination resistors and signal routing used in applications having cascading IC devices is greatly improved. Preferably, the internal termination resistors in each device also have a tight control both in absolute value as well as temperature coefficient, to further improve the matching of impedance and elimination of reflections.

While preferred embodiments of the invention have been described, it will be realized that the embodiments disclosed are illustrative and not restrictive, and that all changes within the meaning and scope of the invention are intended to be embraced by the appended claims.

What is claimed is:

1. A transmission line circuit comprising:
   (a) a circuit board having at least one layer;
   (b) a signal source for providing a signal, said signal source having a source impedance;
   (c) a transmission line running along said circuit board for transmitting the signal, said transmission line having a characteristic line impedance;
   (d) two or more integrated circuit (IC) devices including one chain-ending IC device, each of said two or more IC devices being positioned along said circuit board so as to receive the signal from said signal source by way of said transmission line, and each of said IC devices having an INPUT pin, an IN/TERM pin, and an internally located resistor coupled between said INPUT pin and said IN/TERM pin, said resistor having a resistive value which matches said line impedance;
   (e) said transmission line being connected to the INPUT pin and the IN/TERM pin of each of said two or more IC devices other than the chain-ending IC device, so that the internal resistor of that device is bypassed by said transmission line; and (f) said transmission line further being connected to the INPUT pin of the chain-ending IC device, and the IN/TERM pin of the chain-ending IC device being connected to a reference.

2. A transmission line circuit according to claim 1 wherein the INPUT pin and the IN/TERM pin of each of said IC devices are located directly across from one another on each IC device.

3. A transmission line circuit according to claim 2 wherein the source impedance matches the line impedance.

4. A transmission line circuit according to claim 3 wherein said two or more IC devices are positioned on said circuit board in a manner such that said transmission line runs along said circuit board in a straight line.

5. A transmission line circuit according to claim 3 wherein said two or more IC devices are positioned on a single layer of said circuit board and said transmission line runs along the same layer of said circuit board.

6. A transmission line circuit according to claim 3 wherein the INPUT pin of each of said two or more IC devices is coupled to a high impedance input stage of that device.

7. A transmission line circuit according to claim 3 wherein said circuit board is a printed circuit board and said transmission line is a printed circuit board trace.

8. A transmission line circuit according to claim 3 wherein said reference is the most negative supply voltage in said transmission line circuit.

9. A transmission line circuit according to claim 3 wherein said signal has transition times of 10 nanoseconds or less.

10. A transmission line circuit according to claim 3 wherein the internally located resistors of said IC devices have an absolute value tolerance of ±1% and a temperature coefficient within ±200 ppm/° C.

11. A transmission line circuit comprising:
(a) a circuit board having at least one layer;
(b) a first signal source for providing a first signal, said first signal source having a first source impedance;
(c) a second signal source for providing a second signal complementary to said first signal, said second signal source having a second source impedance equal to the first source impedance;
(d) a first transmission line running along said circuit board for transmitting the first signal, said first transmission line having a first characteristic line impedance;
(e) a second transmission line running along said circuit board for transmitting the second signal, said second transmission line having a second characteristic line impedance equal to the first characteristic line impedance;
(f) two or more integrated circuit (IC) devices including one chain-ending IC device, each of said two or more IC devices being positioned along said circuit board so as to receive the first signal from said first signal source by way of said first transmission line and to receive the second signal from said second signal source by way of said second transmission line, each of said IC devices having a first INPUT pin, a first IN/TERM pin and a first internally located resistor coupled between said first INPUT pin and said first IN/TERM pin, said first resistor having a resistive value which matches said first line impedance, each of said IC devices further having a second INPUT pin, a second IN/TERM pin and a second internally located resistor coupled between said second INPUT pin and said second IN/TERM pin, said second resistor having a resistive value which matches said second line impedance;

(g) said first transmission line being connected to the first INPUT pin and the first IN/TERM pin of each of said two or more IC devices other than the chain-ending IC device, so that the first internal resistor of that device is bypassed by said first transmission line;

(h) said second transmission line being connected to the second INPUT pin and the second IN/TERM pin of each of said two or more IC devices other than the chain-ending IC device, so that the second internal resistor of that device is bypassed by said second transmission line; and (i) said first transmission line further being connected to the first INPUT pin of the chain-ending IC device, said second transmission line further being connected to the second INPUT pin of the chain-ending IC device, and the first IN/TERM pin and the second IN/TERM pin of the chain-ending IC device being connected to one another.

12. A transmission line circuit according to claim 11 wherein the first INPUT pin and the first IN/TERM pin of each of said IC devices are located directly across from one another on each IC device, and the second INPUT pin and the second IN/TERM pin of each of said IC devices are located directly across from one another on each IC device.

13. A transmission line circuit according to claim 12 wherein the first source impedance matches the first line impedance and the second source impedance matches the second line impedance.

14. A transmission line circuit according to claim 13 wherein said two or more IC devices are positioned on said circuit board in a manner such that said first and second transmission lines run along said circuit board in a straight line.

15. A transmission line circuit according to claim 13 wherein said two or more IC devices are positioned on a single layer of said circuit board and said first and second transmission lines run along the same layer of said circuit board.

16. A transmission line circuit according to claim 13 wherein the first and second INPUT pins of each of said two or more IC devices is coupled to a high impedance input stage of that device.

17. A transmission line circuit according to claim 13 wherein said circuit board is a printed circuit board and said first and second transmission lines are printed circuit board traces.

18. A transmission line circuit according to claim 13 wherein said first and second signals have transition times of 10 nanoseconds or less.

19. A transmission line circuit according to claim 13 wherein a first terminal of a capacitor is connected to the node formed by the connection of the first IN/TERM pin and the second IN/TERM pin of the chain-ending IC device and a second terminal of said capacitor is connected to a reference.

20. A transmission line circuit according to claim 13 wherein the first and second internally located resistors of said IC devices have an absolute value tolerance of ±1% and a temperature coefficient within ±200 ppm/° C.

21. An integrated circuit (IC) device having
(a) an INPUT pin connected to a first transmission line portion;
(b) an IN/TERM pin connected to a second transmission line portion, the INPUT pin and the IN/TERM pin being located directly across from one another on said IC device; and (c) a bypass-able internally located resistor coupled between said INPUT pin and said IN/TERM pin, whereby said internally located resistor can be bypassed by directly connecting, underneath said IC device, a third transmission line portion between said INPUT pin and said IN/TERM pin.

* * * * *